United States Patent
Kaczynski

(10) Patent No.: US 6,347,458 B1
(45) Date of Patent: Feb. 19, 2002

(54) DISPLACEABLE X/Y COORDINATE MEASUREMENT TABLE

(75) Inventor: Ulrich Kaczynski, Bad Nauheim (DE)

(73) Assignee: Leica Microsystems Wetzlar GmbH (DE)

( * ) Notice: Subject to any disclaimer, the term of this patent is extended or adjusted under 35 U.S.C. 154(b) by 0 days.

(21) Appl. No.: 09/464,559

(22) Filed: Dec. 16, 1999

(30) Foreign Application Priority Data

Dec. 17, 1998 (DE) .......................................... 198 58 428

(51) Int. Cl.[7] .............................................. G01B 5/008
(52) U.S. Cl. ........................... 33/503; 33/1 M; 33/573; 356/500; 269/902
(58) Field of Search ................ 356/500, 237.2, 356/237.3; 33/503, 533, 613, 645, 568, 573, 1 M; 269/902

(56) References Cited

U.S. PATENT DOCUMENTS

| | | | |
|---|---|---|---|
| 4,118,869 A | * 10/1978 | Hartung et al. | 33/1 M |
| 4,589,746 A | * 5/1986 | Pavone | 356/500 |
| 4,763,420 A | * 8/1988 | McCabe et al. | 33/503 |
| 4,770,531 A | * 9/1988 | Tanaka et al. | 356/500 |
| 4,882,847 A | * 11/1989 | Hammelgarn et al. | 33/503 |
| 5,363,196 A | 11/1994 | Cameron | 356/358 |
| 5,836,080 A | * 11/1998 | Inagaki et al. | 33/568 |
| 5,909,938 A | * 6/1999 | Brenner et al. | 33/503 |
| 6,219,931 B1 | * 4/2001 | Roth | 33/573 |
| 6,285,457 B2 | * 9/2001 | Ukaji | 356/500 |

FOREIGN PATENT DOCUMENTS

DE 198 19 492 A 1 11/1999

OTHER PUBLICATIONS

K.D. Roth, et al. "Mask Metrology Using the LEICA LMS IPRO for Semiconductor Production"; Mitteilungen Für Wissenschaft und Technik Bd. XI, No. 4, pp. 130–135, Oct. 1997 (Article W/English Summary).

* cited by examiner

Primary Examiner—G. Bradley Bennett
(74) Attorney, Agent, or Firm—Brown, Rudnick, Freed & Gesmer

(57) ABSTRACT

A displaceable X/Y coordinate measurement table having two orthogonally arranged measurement mirrors for interferometric position determination is described. The displaceable measurement table, a mirror body carrying the measurement mirrors, and the receptacle for the substrate are embodied as separate components. The mirror body has a number of support points on its upper side and lower side for supporting a substrate or a receptacle above the upper side and for supporting the mirror body on the lower points above the measurement table. The mirror geometry is therefore unaffected by the weight of various substrates. The two measurement mirrors are integrated into a one-piece mirror body made of a material having an extremely low coefficient of thermal expansion. The described embodiments have frame-shaped openings in the X/Y coordinate measurement table and mirror body, which makes the measurement table suitable for both reflected and transmitted applications.

28 Claims, 4 Drawing Sheets

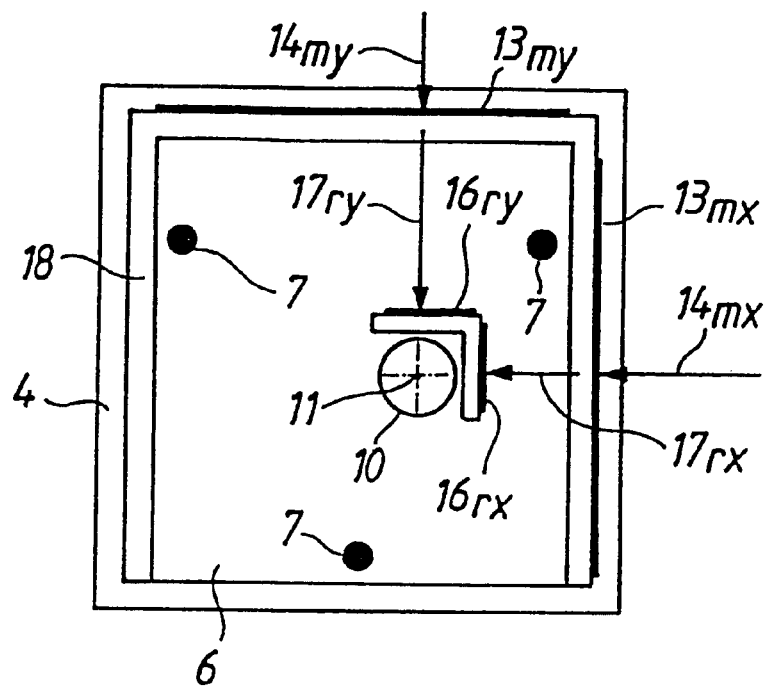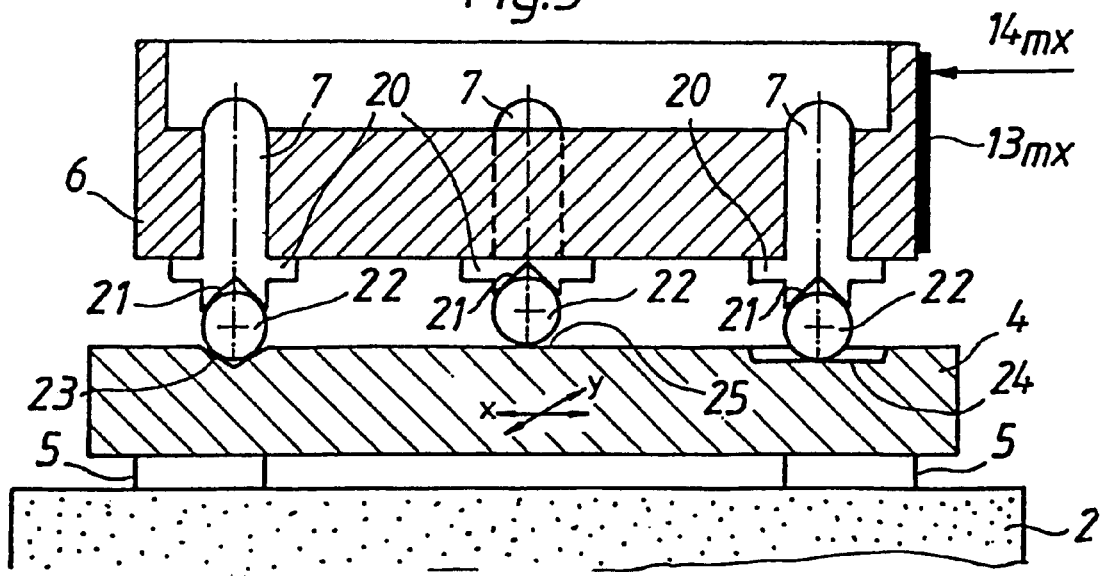

DISPLACEABLE X/Y COORDINATE MEASUREMENT TABLE

CROSS REFERENCE TO A RELATED APPLICATION

This application claims priority from an earlier filed German Patent Application DE 198 58 428.8-52 filed on Dec. 17, 1998, which German application is incorporated herein by reference.

FIELD OF THE INVENTION

The present invention relates generally to the field of analytical instruments used for determining a location of an object, such as a substrate in an analytical instrument. More particularly, the invention relates to a displaceable X/Y coordinate measurement table used for interferometrically determining the coordinates of the substrate. The X/Y coordinate measurement table of the present invention is designed in such a way that the substrate positioned on the measurement table is accessible from above and from below.

BACKGROUND OF THE INVENTION

Measurement tables are used in wafer steppers and in high-precision coordinate measuring instruments, such as interferometers. The measurement mirrors mounted on the tables make it possible to determine interferometrically the current position of the table while the table itself supports the analyzed or processed substrates.

A measurement table of that type is described in German Patent Application DE 198 19 492.7-52 as a component of a coordinate measuring instrument used for a highly accurate coordinate determination of structures on substrates, e.g. masks and wafers, but, in particular, of structures on transparent substrates. The measurement table described in that Application is vertically and horizontally displaceable and has a receiving rim for receiving the substrate. In addition, the measurement table is equipped with a frame-shaped opening, so that the received substrate is accessible from both above and below. Flat mirrors attached to two mutually perpendicular sides of the measurement table serve as measurement mirrors for a laser interferometer system that determines the X/Y position of the measurement table.

The described measuring instrument comprises a reflected-light illumination device and a transmitted-light illumination device having a common optical axis through an opening in the measurement table. Also present are an imaging device and a detector device for observing the analyzed structures. The measured coordinates of a particular analyzed structure are derived from the current interferometrically measured coordinates of the measurement table and from the coordinates of the analyzed structure relative to the optical axis of the table.

The article "Maskenmetrologic mit der LEICA LMS IPRO für die Halbleiterproduktion" [Mask metrology using the LEICA LMS IPRO for semiconductor production] by K.-D. Röth and K. Rinn, Mitteilungen für Wissenschaft und Technik Vol. XI, No. 5, pp 130–135, Oct. 1997, describes a coordinate measuring instrument in which a measurement table of the aforesaid type is used to receive and analyze various substrates. The instrument comprises an interferometer and a separate interferometer measurement beam path for each coordinate axis X and Y of the measurement table. Two measurement mirrors located at the ends of the two interferometer measurement beam paths are attached to two mutually perpendicular sides of the measurement table.

Such an instrument utilizes the two mirrors to interferometrically determine the coordinates of the measurement table, which coordinates are then used to calculate the coordinates of various structures on the substrates.

However, the above-described measuring instrument does not allow a user to perform high accuracy coordinate measurements of structures and defects at a nanometer scale, because in order to achieve such an accuracy, a number of instrumental error sources has to be taken into account and reduced or eliminated. For example, it would be desirable to eliminate such sources of measurement errors as thermal expansion of the materials of which various components of the instrument are made, changes in ambient temperature, humidity and air pressure affecting the wavelength of light in the interferometer, vibrations of the building where the instruments is located. The need, therefore, exists to provide a measuring instrument in which instrumental errors affecting the precision of the measurements are either minimized or eliminated.

The geometry of the measurement mirrors often also becomes a source of errors, since unidentified changes in the mirror geometry result in errors of the coordinates of the measurement table. This problem occurs generally in measurement tables which employ interferometric position determination, regardless of whether the measurement tables are utilized in coordinate measuring instruments or in steppers. The need, therefore, exists to provide an analytical instrument which is able to compensate for geometrical and other imperfections of the instrument.

SUMMARY OF THE INVENTION

The present invention addresses the above-described needs by providing an instrument in which a wide variety of instrument error sources is taken into account instrumentally and by providing various methods for minimizing or eliminating such error sources.

It is, therefore, an object of the present invention to minimize the effect of mechanical, physical, geometrical and other instrumental errors on the accuracy of high precision measurements performed by the instrument. For example, in order to minimize the effect of external building vibrations, the measuring instrument is mounted on a vibration-damped, air-mounted granite block with the air-mounted measurement table coupled to the block. In order to minimize the effects of changes in relative humidity and temperature of the surrounding environment, the measuring instrument of the present invention is housed in a climate-controlled chamber. Because the wavelength of the interferometer measurement light depends on air pressure, temperature, humidity, and the composition of air, the instantaneous value of the wavelength is continuously measured and monitored by taking into account a comparison measurement of a standard test article in calculating the final wavelength measurement result.

It is another object of the present invention to provide a device and method for error-free interferometric determination of the position of the measurement table by using software corrections of the instrumental errors. To achieve an error-free measurement, it is always desirable for the measurement mirrors to be flat, not tilted, and disposed orthogonally to one another. Since these criteria are hard to achieve instrumentally on a nanometer scale, the residual instrumental errors attributed to geometrical imperfections of the measurement mirrors, such as flatness, orthogonality, and tilting are detected and then compensated for by software corrections. In order to compensate for instrumental errors by using software corrections, the once-identified errors attributed to the mirrors should remain the same during subsequent measurements, i.e. even after the analyzed mask has been changed. This is achieved in the present invention by fabricating the measurement mirrors from a material with an extremely low coefficient of thermal expansion in order to minimize the effect of temperature changes on mirror geometry.

However, since the measurement mirrors are attached to the measurement table, the design of the measurement table itself becomes a critical component in measurement error reduction. For example, the flexible air-bearing system causes the measurement table to deform slightly, therefore, adversely affecting the mirror geometry. In addition, the analyzed masks and wafers have different dimensions and weights: the lightest mask, for example, weighs only about 80 g, but the heaviest weighs approximately 1.4 kg, while wafer chunks are even much heavier. If substrates with very different weights are placed on the measurement table one after another, the measurement table deforms differently each time.

The measurement table is also slightly deformed during displacement. The reason is that as the measurement table is displaced, it slides on the air bearings on the granite block the surface of which is not exactly flat on a nanometer scale. The measurement table is deformed during the displacement as a result of this residual irregularity of the granite block. These deformations of the measurement table in turn cause the measurement mirrors attached to it to deform and change their relative positions with respect to each other. In addition, due to a deformation of the measurement table, the position of the substrate relative to the measurement mirrors changes and the substrates become also deformed. While all these deformations and positional changes are very small, they can unpredictably affect the mirror geometry. In coordinate measuring instruments, such deformations and changes lead to errors in the measurement results. In the case of steppers, they result in positioning errors during the individual exposure operations.

It is therefore also an object of the present invention to provide an analytical instrument having an C/Y coordinate measurement table with measurement mirrors for interferometric position determination, in which the changes in the measurement table geometry caused by temperature and by load changes do not affect the geometry of the measurement mirrors. Moreover, in such an instrument the position of the measurement mirrors remains stable relative to the analyzed substrates. The measurement table of the present invention is suitable for analytical instruments using reflected or transmitted light for analyzing substrates of various weights, such as, for example, coordinate measuring instruments or wafer steppers.

The analytical instrument of the present invention comprises a displacable X/Y coordinate measurement table having a receptacle for an analyzed substrate and a mirror body carrying two measurement mirrors located at the ends of two separate interferometer measurement beam paths for determining the X and Y coordinates. The mirror body carrying the measurement mirrors and the receptacle for the substrate are implemented as separate components. In addition, the measurement mirrors define a surface region with a number of support points comprising spaced apart support points disposed substantially vertically on the upper and lower sides of the mirror body. Therefore, the support points disposed on the upper surface of the mirror body comprise the upper support points, the support points disposed on the lower surface comprise the lower support points. In the arrangement of the present invention the mirror body is supported on the measurement table only by the lower support points. The receptacle for the substrate or a substrate of suitable size is placed onto the upper support points.

The advantage of the arrangement is in the fact that the measurement table, the mirror body, and the receptacle for the substrate do not contact each other directly. When a substrate is placed on the measurement table, the support points receive the substrate and support it on the measurement table without passing the load on the mirror body. Each pair of oppositely spaced support points defines a vertical axis through which the applied weight is transferred onto the measurement table. As a result, the position of the mirror body remains undisturbed by the placement of the substrate or a receptacle for the substrate, so that the geometry of the measurement mirrors remains unaffected by varying weights of different substrates.

Deformations of the measurement table caused by temperature fluctuations or during displacement of the measurement table also have no effect on the mirror bodies, and thus on the measurement mirrors or their geometry. Since the substrate or the receptacle for the substrate placed onto the upper support points contacts the mirror body only at the upper support points and not over the entire surface, temperature differences between the substrate and the mirror body also have no effect on the measurement mirrors.

One of the embodiments of the present invention comprises a measurement table, a single piece mirror body fabricated from a material having a very low coefficient of thermal expansion and the two measurement mirrors integrated into the outer sides of the mirror body. The thermal expansion of the material, if any, is such that it does not affect the measurements performed with the help of the analytical instrument of the present invention. As an example, a coefficient of thermal expansion of the material can be from about $0.01 \times 10^{-6}$°C. to about $0.03 \times 10^{-6}$°C. The measurement mirrors can be integrated into the mirror body in various ways. One possibility is to manufacture the measurement mirrors separately as thin mirror surface elements. Each thin mirror surface element comprises a thin base surface onto which an actual measurement mirror is deposited. The mirror surface elements with the mirrors are then attached to the outer sides of the mirror body. For example, such an attachment can be accomplished by adhesive bonding. The problem that exists with every type of attachment, however, is that the mirror surface elements could become slightly distorted or bent. In order to prevent thermal or mechanical distortions, it proves advantageous to manufacture the base surface of the mirror surface elements and the mirror body of the same material.

The best way of integrating the measurement mirrors onto the mirror body is to mount the measurement mirrors directly onto the outer sides of the mirror body. As compared to the aforesaid methods, such a way is advantageous in that the measurement mirrors are not bent or distorted by a subsequent attachment procedure.

If the surface of the mirror body is sufficiently smooth, the measurement mirror can be formed by depositing it as one deposition layer onto the outer side of the mirror body. If, on the other hand, the surface of the mirror body contains irregularities such as pores, fine scratches or the like, then the measurement mirror is formed by depositing multiple layers onto the mirror body. In the case of multiple layer deposition, a precoat for the actual mirror is first deposited onto the mirror body and flattened by lapping or another high-quality surface preparation method. After lapping, the precoat becomes sufficiently flat and ready for deposition of a subsequent layer or layers. After the deposition is completed, the actual measurement mirror is mounted to the mirror body.

Regardless the number of layers forming the measurement mirror, the base coat for the subsequently deposited layers should be as flat as possible. When a lower layer deposited on the mirror body is subjected to lapping, the best flatness is achieved for a layer with a large surface. A large surface of the layer is usually optimally flat in the center and curves very slightly toward the edges. Therefore, the outer surfaces of the mirror body are designed to be sufficiently high, allowing the optimization of the surface processing to produce a wide flat surface for the measurement mirror. However, if the high outer edges make the mirror body too thick, it becomes too heavy. Manufacturing costs of a thick mirror body made of a material with an extremely low thermal expansion coefficient can become quite high, since such materials are usually very expensive.

It is, therefore, yet another object of the present invention to provide a particularly advantageous embodiment comprising the mirror body with an elevated rim having a particularly large, flat outer surface to which a measurement mirror is attached. The elevated rim is located on the surface of the mirror body and, in particular, on the three sides of the mirror body, forming a recessed area on the upper side of the mirror body. The recessed area is open at the fourth side, the fourth side being used for placing a substrate onto the upper support points. The advantage of this embodiment is that large cuter sides with sufficiently flat mirror surfaces can be manufactured of a minimal amount of material.

One of the embodiments of the present invention provides for a plurality of studs, wherein each stud has an upper and lower end and passes through a through opening in the mirror body and is secured in place in the opening. The lower ends of the studs support the mirror body on the measurement table, the upper ends of the studs support a substrate receptacle or a substrate itself, so that the receptacle or the substrate are supported in the instrument without contacting or deforming the mirror body. The preferably cylindrical studs are made of a material having an extremely low coefficient of thermal expansion, or they can be sintered in directly during manufacture of the mirror body. Other shapes of the studs can be used, depending on the shape of the through openings. The studs are inserted into the respective through openings of the mirror body stress-free and secured in place by fitting, adhesive bonding or any other suitable technique. Sintering has the advantage over adhesive bonding in that the sintered studs are reliably inelastic. When adhesive bonding is used to secure the studs in the openings, an adhesive that dries to become very firm is usually selected to result in firm, inelastic bonding between the mirror body and the studs.

In one of the embodiments of the present invention each stud is implemented with a support portion on which the mirror body is supported. The support portions of the studs secure the mirror body in its intended position and prevent the mirror body from sliding along the studs. If the studs are sintered into the mirror body during manufacturing, the support portions are built into the mirror body in order to maximize the area of contacting surfaces during the sintering.

The ends of the studs are preferably spherical to ensure the best possible support function. Since such spherical ends can wear faster than other pieces of the analytical instrument, the studs or even the mirror body itself would need to be replaced after a certain time. The replacement procedure can be fairly complex and expensive. Therefore, to eliminate such a problem the lower ends of the studs comprise recessions which receive ball shaped members attached to the recessions by adhesive bonding or other suitable means. Such ball shaped members can be easily and economically replaced after they are worn out without having to replace the studs or the mirror body. To ensure reliable positioning of the mirror body on the measurement table, the surface of the measurement table comprises a plurality of recessed areas suitable to receive the lower ends of the studs. These recessed areas are shaped and situated in such a way that they don't affect the mirror geometry by displacing or deforming the mirror body.

In yet another embodiment of the present invention the plurality of recessed areas in the surface of the measurement table is provided to ensure stress-free thermal expansion of the mirror body when the lower ends of the studs are positioned in the recessed areas. In that embodiment a recessed area receiving the spherical lower end of the first stud or a ball shaped member is recessed into the rim region on the surface of the measurement table, therefore, securing the position of the stud in the recessed area.

In another particular embodiment of the present invention comprising three studs, the lower end of the second stud rests in a V-shaped groove disposed in the surface of the measurement table and extending parallel to an outer edge of the measurement table. The V-shaped groove has a longitudinal axis in line with the ball recess. The spherical lower end of the second stud engages into this V-groove and can be guided in a stress-free fashion in the groove if the mirror body thermally expands. The spherical lower end of the third stud moves unrestrictedly along a smooth sliding surface without distorting the mirror surface. Provided that the first stud is secured in its respective recessed area, the position and orientation of the mirror body relative to the measurement table remains unchanged, since in such an embodiment thermal expansion does not affect the outer edges of the mirror body and the measurement table, which outer edges remain parallel. The recessed area, the V-groove, and the flat sliding surface thus constitute a stress-free positive guidance system for the three-point mounting system of the mirror body unaffected by possible displacements of the mirror body relative to the measurement table caused by to thermal expansion.

Similarly, the above-described stress-free positive guidance system can be implemented in the second ends of the studs secured in the mirror body. In this embodiment, three recesses suitable for receiving and attaching three ball shaped members are provided in the surface of the measurement table. The lower ends of the three studs secured in the mirror body comprise a recess, a V-groove, and a flat sliding surface, respectively. The recess, the V-groove and the flat sliding surface rest on the upper side of the ball shaped members, allowing stress-free, positively guided thermal expansion or contraction of the mirror body and the measurement table relative to one another.

In yet another embodiment of the present invention the mirror body does not comprise the studs. Instead, the three studs are secured in the measurement table or shaped onto its surface. The three studs protrude and are removably inserted into three openings inside the mirror body. The upper end of the first stud comprises a recess, the upper end of the second stud comprises a V-groove in the direction of the recess, the upper end of the third stud has a flat sliding surface used to support the mirror body in a stress-free fashion. The recess, the V-groove, and sliding surface serve to receive the lower support points of the mirror body and to provide stress-free mounting of the mirror body.

The lower support points on the internal surface of the mirror body can be implemented in various configurations. In one example, the openings in the mirror body extend very deeply inside the mirror body, almost up to the upper surface of the mirror body. Fitted into the mirror body above the openings are balls with an upper surface extending above the upper surface of the mirror body and a lower surface extending into the openings. The lower surfaces of the balls contact the recess, the V-groove, and the flat sliding surface of the three studs providing the lower support points for the mirror body. As a result, the studs support the mirror body at these lower support points, so that the mirror body does not contact the measurement table. Thus neither thermal fluctuations nor mechanical distortions of the measurement table affect the mirror body or the mirror geometry. At the same time the upper surfaces of the balls extending above the surface of the mirror body provide the upper contact points for receiving an analyzed substrate or a receptacle for a substrate.

It is also contemplated in the present invention that instead of the balls, short semispherical studs can be utilized on the upper surface of the mirror body. In such an embodiment the semispherical upper ends of the studs extend above the upper surface of the mirror body and provide the upper support points. The lower ends of the semi spherically shaped studs extend into the openings in the mirror body and provide the lower contact points for supporting the mirror body on the measurement table. The lower support points rest stress free on the recess, the V-groove, and the sliding surface of the three studs inserted in the openings.

In yet another embodiment of the present invention the openings do not extend so deeply into the mirror body, leaving a thicker layer of the material above the openings, which results in greater warping stiffness of the mirror body as a whole.

To provide a stress-free positive guidance system for the lower support points, the recessed areas for accommodating three ball shaped members are made in the upper ends of the three openings. These three ball shaped members rest on the three studs containing a recessed area, a V-groove, and a sliding surface, respectively, and form the lower support points facing the studs. Alternatively, the stress-free positive guidance system can also be provided by a recessed area, a groove, and a sliding surface at the respective upper ends of the openings. The studs located below the upper end of the openings comprise the recessed areas for receiving three ball shaped members. The recessed area, the V-groove, and the sliding surface rest on the ball shaped members and ensure stress-free, positively guided relative expansion or contraction of the measurement table with respect to the mirror body. In that embodiment three half-balls mounted on the upper surface of the mirror body provide the upper support points for a receptacle or a substrate placed on them. The balls can be attached to the upper surface of the mirror body by adhesive bonding or sintering or any other suitable method.

In a particular embodiment of the measurement table it can be used universally for both reflected and transmitted light applications, such as, for example, coordinate measuring instruments and wafer steppers. Since the measurement table, the mirror body, and the receptacle each have centrally located frame-shaped openings lined up above one another, the substrate placed on the measurement table is easily accessible from above and below for reflected and transmitted light applications. The embodiment is also advantageous in that the openings provided in the mirror body decrease the weight of the mirror body and reduce the costs of manufacture.

BRIEF DESCRIPTION OF THE DRAWINGS

The invention will be explained in more detail with reference to exemplary embodiments and in conjunction with the schematic drawings, in which:

FIG. 2 y is a plan view of an exemplary embodiment of a measurement table according to the present invention for reflected-light applications;

FIG. 3 is a cross sectional view of a first exemplary embodiment of a measurement table according to the present invention for reflected light applications;

DETAILED DESCRIPTION OF THE INVENTION

In the following detailed description of the invention, reference is made to the accompanying drawings, which form a part thereof, and in which specific preferred embodiments for practicing the invention are shown by way of illustration. These embodiments are described in sufficient detail to enable those skilled in the art to practice the invention, and it is to be understood that other embodiments may be utilized and that logical, mechanical, chemical and electrical changes may be made without departing from the spirit and scope of the present invention. The following detailed description is, therefore, not to be taken in a limiting sense, and the scope of the present invention is defined only by the appended claims.

Figure 1:
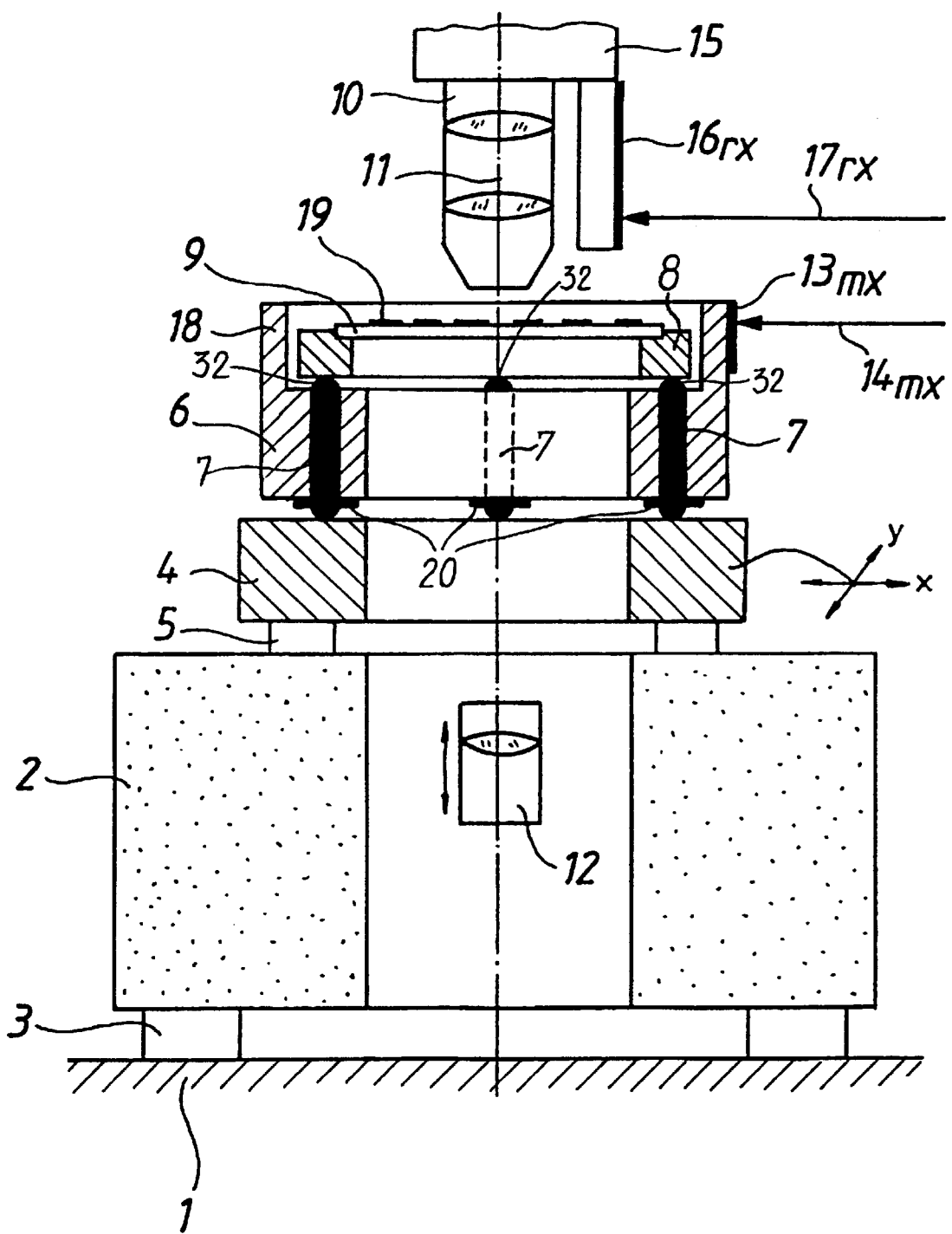
FIG. 1 is a cross sectional view of a coordinate measuring analytical instrument for reflected-light and transmitted-light illumination having a measurement table according to the present invention.

In FIG. 1, a block 2 made preferably of granite is mounted on a foundation I and is insulated from vibrations of foundation 1 by air springs 3. An X/Y coordinate measurement table 4 is supported on air bearings 5 coupled to granite block 2. X/Y coordinate measurement table 4 is displaceable horizontally in two mutually perpendicular directions, indicated in FIG. 1 as the X and Y axes. (The drive systems for moving the measurement table 4 are not shown).

Three studs 7 with rounded ends pass through a mirror body 6 in a stress-free fashion and extend beyond the mirror body, as shown in FIG. 1, to support mirror body 6 on measurement table 4 and a substrate 9 or a receptacle 8 on mirror body 6. The location of studs 7 in mirror body 6 provides stable three-point support of mirror body 6 on the X/Y coordinate measurement table 4. In the particular embodiment shown in FIG. 1, two studs 7 are located at the left and right sides of the section plane, and the third stud 7 is located at the center behind the section plane. In order to minimize the contact surface between studs 7 and the surfaces contacted by the studs, the lower ends of studs 7 are spherically shaped.

As also shown in FIG. 1, the lower ends of studs 7 comprise integrated support portions 20 that support mirror body 6, secure the mirror body in its intended position and prevent it from sliding along the studs. In the illustrated embodiment, studs 7 were prefabricated and later secured in mirror body 6 by adhesive bonding (an adhesive layer is not shown) or by any other suitable technique. Adhesives suitable for bonding are those that become very hard and inelastic after they dry, providing maximally inelastic adhesive bonding between the studs and the mirror body.

Mirror body 6 is made as a single piece of a material having a very low coefficient of thermal expansion. Preferably, the mirror body is made of a ceramic. Its dimensions are therefore subjected to only the slightest thermal fluctuations. Studs 7 are also made of a material having an extremely low coefficient of thermal expansion, preferably from the same material as mirror body 6, which ensures that mirror body 6 and studs 7 are not affected by thermal expansion. Resting on upper ends 32 of studs 7 is a receptacle 8 having a frame-shaped recessed area for receiving substrate 9 with structures 19 on it. It is also contemplated by the present invention that substrate 9 can be placed directly onto upper ends of studs 7.

The two measurement mirrors $13_{mx}$ and $13_{my}$ (mirror $13_{my}$ is not shown) used for interferometrically determining the X-Y coordinates of the X/Y coordinate measurement table 4 are attached to mirror body 6. In this example, the mirrors are mounted directly onto the mirror body.

Because mirror body 6 with attached measurement mirrors $13_{mx}$ and $13_{my}$ is supported on X/Y coordinate measurement table 4 only by studs 7, the measurement mirrors do not have direct contact with substrate 9 and measurement table 4. Also, since substrate 9 or receptacle 8 is received only by the upper end of studs 7, the substrate or the receptacle do not exert any weight on mirror body 6 or the geometry of measurement mirrors $13_{mx}$ and $13_{my}$, but only on X/Y coordinate measurement table 4.

In the embodiment shown in FIG. 1, a mirror carrying arrangement such as mirror body 6 has an elevated rim 18 surrounding the mirror body along three of its sides. Measurement mirror $13^{mx}$ for the X coordinate measurements is attached to mirror body 6 at the outer side of the elevated rim 18. An interferometer measurement beam $14_{mx}$ used for interferometric determination of an X coordinate of coordinate measurement table 4 is directed onto measurement mirror $13_{mx}$. Measurement mirror $13_{my}$ (not shown) is also attached to the outer side of elevated rim 18 of mirror body 6. Directed onto mirror $13_{my}$ is an interferometer measurement beam $14_{my}$ (also not shown in FIG. 1) used for the determination of an Y coordinate of X/Y coordinate measurement table 4.

A lens 10 defines an optical path 11, which is directed toward a surface of substrate 9. A condenser 12, which provides transmitted light illumination is movably disposed along optical path 11 below substrate 9. To provide the transmitted light illumination, granite block 2, X/Y coordinate measurement table 4, mirror body 6, and receptacle 8 comprise lined up frame shaped openings along optical path 11. Lens 10 is mounted on a stand 15 to which a reference mirror $16_{rx}$ is attached as shown in FIG. 1. Reference mirror $16_{rx}$ is used for interferometric determination of an X coordinate of X/Y coordinate measurement table 4 and is located at a fixed distance from optical path 11. In addition, a reference mirror 16ry (not shown in FIG. 1 ) is attached to stand 15 and is used for interferometric determination in an Y coordinate of the measurement table.

FIG. 2 shows a plan view of X/Y coordinate measurement table 4 according to the present invention as having mirror body 6 comprising elevated rim 18 surrounding three sides of the measurement table. X/Y coordinate measurement table 4 is supported by studs 7, which are passed through mirror body 6 in a stress-free fashion and are immovably joined to it. A receptacle for a substrate (not depicted here) can be placed onto studs 7.

Two measurement mirrors $13_{mx}$ and $13_{my}$ are attached to mirror body 6 by being directly mounted onto two mutually perpendicular sides of the mirror body. Measurement mirror $13_{mx}$ is provided for an interferometer measurement beam path $14_{mx}$ used for the X coordinate determination, and measurement mirror $13_{my}$ is provided for an interferometer measurement beam path $14_{my}$ used for the Y coordinate determination, as shown in FIG. 2. Reference mirror $16_{rx}$ and $16_{ry}$ are located along interferometer measurement beam paths $14_{mx}$ and $14_{my}$ respectively. These mirrors are situated in the vicinity of and at a fixed distance from lens 10 and optical path 11. A reference beam path $17_{rx}$ for the X axis is directed onto reference mirror $16_{rx}$ and a reference beam path $17_{ry}$ for the Y axis is directed onto reference mirror $16_{ry}$.

In FIG. 2 X/Y coordinate measurement table 4 is shown displaced with respect to optical path 11. Interferometer measurement beams propagating along paths $14_{mx}$ and $14_{my}$ therefore illuminate measurement mirrors $13_{mx}$ and $13_{my}$ not at their respective centers, but somewhat off the centers. In order to be able to determine a position of any substrate feature located anywhere in the analyzed substrate, measurement mirrors $13_{mx}$, $13_{my}$ on the outer sides of mirror body 6 are made at least as long as the maximum dimension in an X or Y direction, or as long as the maximum displacement range of X/Y coordinate measurement table 4.

FIG. 3 shows X/Y coordinate measurement table 4 according to the present invention that is suitable for reflected light applications and has a particularly advantageous configuration of studs 7. In the illustrated embodiment X/Y coordinate measurement table 4 is displaceable in the X and Y directions and is supported by air bearings 5 on a granite block 2. Mirror body 6 rests on X/Y coordinate measurement table 4 by way of three inserted studs 7, wherein each of the studs 7 comprises support portion 20 and wherein the lower ends of the studs comprise a recess 21 into which a ball-shaped member 22 is fitted or adhesively bonded. Measurement mirror $13_{mx}$ receiving incident interferometer measurement beam along path $14_{mx}$ is attached to the side of measurement table 4, as illustrated in FIG. 3.

Also shown in FIG. 3 is the surface of X/Y coordinate measurement table 4 comprising recessed areas serving to receive ball shaped members 22 attached to studs 7, such as a recessed area 23 and a V-groove 24. V-groove 24 extends parallel to an outer edge of the measurement table and, therefore, parallel to an outer edge of mirror body 6. If mirror body 6 undergoes thermal expansion or contraction due to temperature fluctuations, ball-shaped member 22 is positively guided in V-groove 24 by being able to move freely in the longitudinal direction of the V-groove. The outer edges of mirror body 6 thus always remain optimally parallel to the outer edges of X/Y coordinate measurement table 4.

The third stud 7, shown as a middle stud in FIG. 3, does not call for positive guidance in order to prevent distortions of mirror body 6. Therefore, flat surface 25 of X/Y coordinate measurement table 4 does not have any recessed areas corresponding to that stud. This center stud 7 is correspondingly somewhat shorter than the other two studs 7, and it slides on flat sliding surface 25 of X/Y coordinate measurement table 4. In order to improve smoothness of surface 25, a special additional sliding surface can be layered onto X/Y coordinate measurement table 4 (such an additional surface in not shown). Recess 21, V-groove 24, and flat sliding surface 25 all together constitute a stress-free, positively guided support system that always keeps the outer edges of X/Y coordinate measurement table 4 or mirror body 6 parallel to one another in the event of thermal expansion.

Alternatively, instead of providing V-groove 24 and sliding surface 25, it is also possible to arrange a plurality of recessed areas on the surface of the X/Y coordinate measurement table 4 and to stationary engage ball-shaped members 22 in these recesses areas. Stress-free positive guidance is then implemented at the lower ends of studs 7. For that purpose, the lower ends of the studs comprise a recess, a V-groove, and a flat sliding surface, respectively, which lower ends are supported on ball-shaped members 22 and ensure stress-free, positively guided expansion of X/Y coordinate measurement table 4 and mirror body 6.

Figure 4:
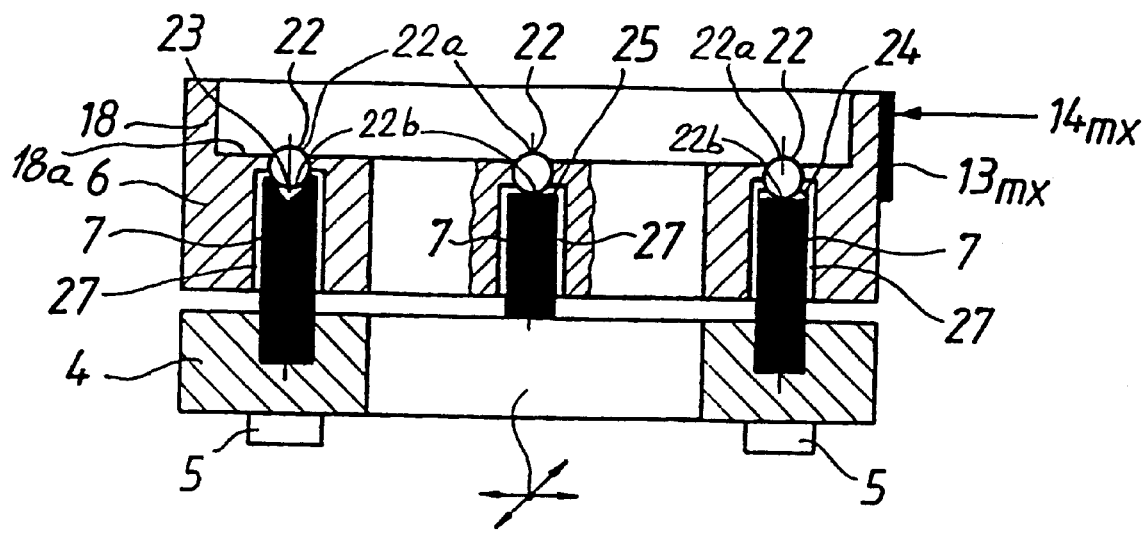
FIG. 4 is a cross sectional view of a second exemplary embodiment of a measurement table according to the present invention for reflected and transmitted light applications.

FIG. 4 shows an embodiment of the present invention suitable for both reflected and transmitted light applications, in which embodiment frame-shaped X/Y coordinate measurement table 4 rests on air bearings 5. Three studs 7, extending vertically upward, are secured in the surface of X/Y coordinate measurement table 4. The upper end of the first stud 7 has recessed area 23. The upper end of the second stud 7 has V-groove 24 whose longitudinal axis coincides with a recessed area 23. The upper end of the third stud 7 comprises flat sliding surface 25.

Disposed above 7 of K/Y coordinate measurement table 4 is mirror body 6 with a frame-shaped opening comprising elevated rim 18 on the outer sides measurement mirror $1_{mx}$ receiving an interferometer measurement beam $14_{mx}$ used for determining X coordinates is attached to the one side of mirror body 6. Measurement mirror $13_{my}$ and interferometer measurement beam $14_{my}$ for determining Y coordinates are attached to another side of the mirror body in a similar fashion and are depicted in FIG. 2.

Three studs 7 of X/Y coordinate measurement table 4 illustrated in FIG. 4 protrude and are removably inserted into three openings 27 made inside mirror body 6. Three ball shaped members 22 are fitted into mirror body 6 above openings 27 by sintering or any other suitable technique. Upper sides 22a of ball shaped members 22 extend above upper surface 18a of mirror body 6, lower sides 22b of ball shaped members 22 extends into openings 27. According to the present invention, upper sides 22a and lower side 22b of ball shaped members 22 provide the necessary upper and lower support points. Mirror body 6 is thereby supported by ball shaped members 22 resting on recess 23, V-groove 24, and flat sliding surface 25 of studs 7, therefore, providing stress-free positive guidance of ball shaped members 22 in the event of thermal expansion of X/Y coordinate measurement table 4.

Substrate 9 or receptacle for a substrate 8 (not shown in FIG. 4) can be placed onto upper sides 22a of ball shaped members 22 without causing distortion of mirror body 6 and without affecting the mirror geometry. In the embodiment illustrated in FIG. 4, interferometer measurement beam $14_{mx}$ is always coplanar with the analyzed substrate. The frame-shaped openings of X/Y coordinate measurement table 4 and mirror body 6 are disposed above one another, so that the substrate is equally accessible from below and above, which is suitable for reflected and transmitted light applications.

Figure 5:
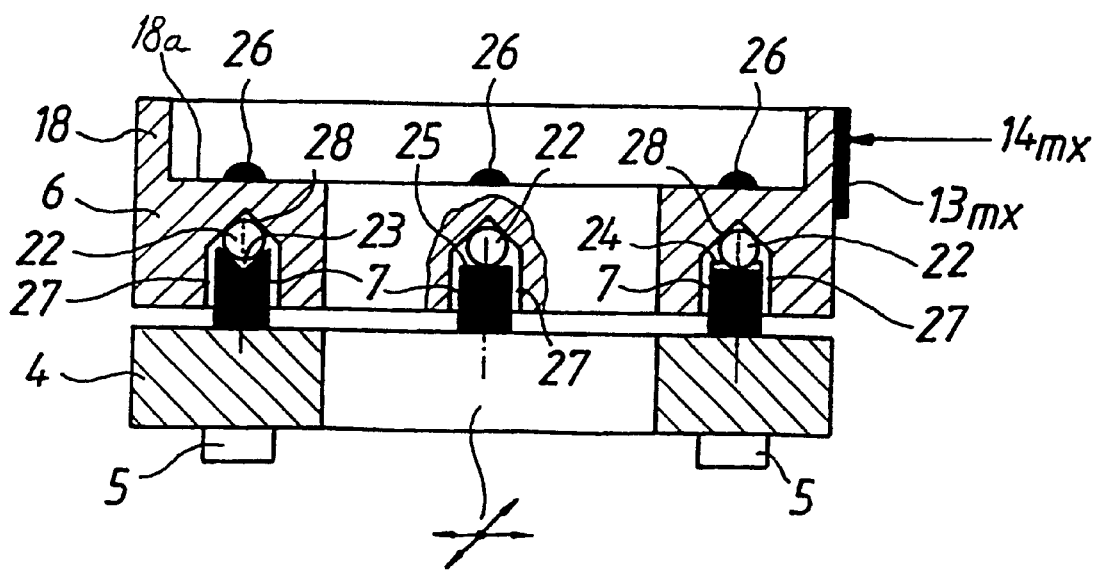
FIG. 5 is a cross sectional view of a third exemplary embodiment of a measurement table according to the present invention for reflected and transmitted light applications.

FIG. 5 shows a cross section of a further exemplary embodiment of a measurement table that is suitable for both reflected and transmitted light applications. As shown in FIG. 5 frame-shaped X/Y coordinate measurement table 4 that rests on air bearings 5. Disposed above X/Y coordinate measurement table 4 is frame shaped mirror body 6 having elevated rim 18 on the sides of the mirror body. Measurement mirror $13_{mx}$ receiving interferometer measurement beam $14_{mx}$ for determining X coordinates is attached to one side of mirror body 6. Measurement mirror $13_{my}$ and interferometer measurement beam $14_{my}$ for determining Y coordinates are attached to another side of the mirror body in a similar fashion and depicted in FIG. 2.

Three studs 7 shown in FIG. 5 extend upward and are shaped or sintered onto the X/Y coordinate measurement table 4. The upper end of the first stud 7 has recess 23, and the upper end of the second stud 7 has V-groove 24 in the direction of recess 23, which V-groove is parallel an outer edge of X/Y coordinate measurement table 4. The upper end of the third stud 7 comprises flat sliding surface 25. Also shown in FIG. 5 are three openings 27 into which studs 7 are removably inserted. The upper ends of studs 7 each has a recess 28 into which ball shaped members 22 constituting the lower support points are inserted. Ball shaped members 22 rest of on recess 23, V-groove 24, and flat sliding surface 25, which all together comprise stress-free positive guidance system of ball shaped members 22 in the event of thermal expansion of measurement table 4 with respect to mirror body 6. Such a guidance system ensures that the outer edges of the mirror body or the mirror table are always aligned in parallel.

The upper support points comprise three half-balls mounted on upper surface 18a of mirror body 6 above recessed areas 28. Receptacle 8 or substrate 9 can be placed onto these upper support points without distorting mirror body 6 and thus without changing the mirror geometry. Because the frame-shaped openings of X/Y coordinate measurement table 4 and mirror body 6 are disposed above one another, the substrate is equally accessible from below and above for both reflected and for transmitted light applications.

Figure 6:
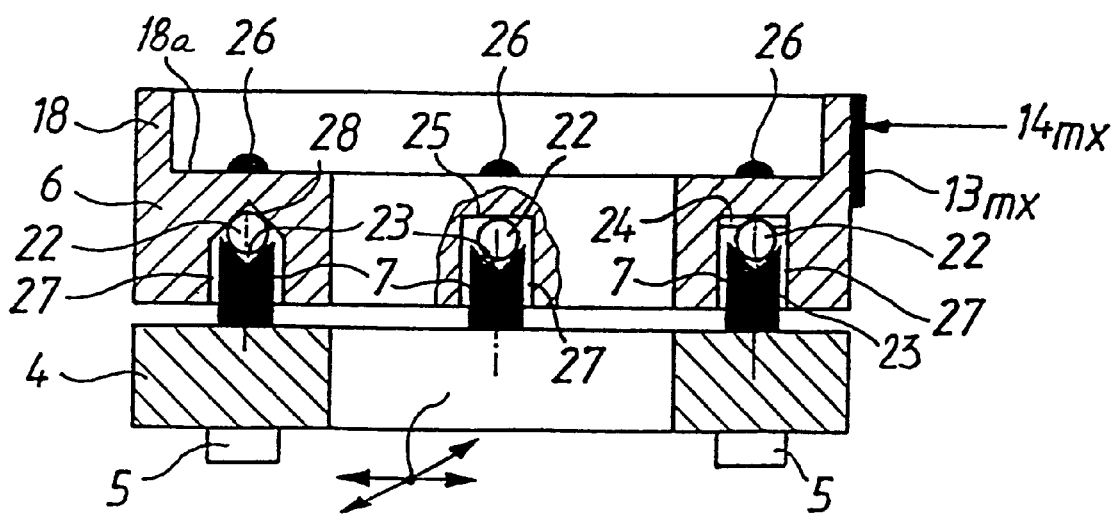
FIG. 6 is a cross sectional view of a fourth exemplary embodiment of a measurement table according to the present invention for reflected and transmitted light applications.

FIG. 6 shows measurement table 4 according to the present invention for reflected and transmitted light applications with a different configuration of the stress-free positive guidance system as compared to FIG. 5. Frame-shaped X-Y-displaceable X/Y coordinate measurement table 4 rests on air bearings 5. Three upwardly extending studs 7 are provided on the upper side of the X/Y coordinate measurement table 4, which studs are removable inserted into opening 27 inside mirror body 6. The upper ends of all three studs 7 have recesses 23 into which ball shaped members 22 are fitted by simply being placed there or by adhesive bonding or by any other suitable technique. Mirror body 6 disposed above X/Y coordinate measurement table 4 is supported by ball shaped members 22.

A ball recess 28, V-groove 24, and sliding surface 25 are respectively provided at the upper ends of three openings 27 shown in FIG. 6 to achieve stress-free positive guidance of ball shaped members 22. V-groove 24 points in the direction of ball recess 28 and at the same time is aligned parallel to the outer edges of measurement table 4 and mirror body 6.

If X/Y coordinate measurement table 4 changes its orientation relative to mirror body 6 due to temperature changes, ball shaped members 22 located below V-groove 24 and sliding surface 25 can move in a stress-free fashion while ball shaped members 22 beneath ball recess 28 remains stationary. As a result, the outer edges of X/Y coordinate measurement table 4 and mirror body 6 always remain parallel.

Three half-balls 26 constituting the upper support points are provided on upper surface 18a of mirror body 6 above openings 27. Substrate 9 or receptacle 8 can be placed onto these without distorting mirror body 6 and thus without changing the mirror geometry. The frame-shaped openings of X/Y coordinate measurement table 4 and mirror body 6 disposed above one another make the substrate accessible from both below and above and therefore equally suitable for reflected and transmitted light applications.

What is claimed is:

1. An analytical instrument comprising:
    an optical system defining an optical path of the analytical instrument and directing light onto a sample;
    a measurement table disposed along the optical path; and
    a guiding system disposed along the optical path of the analytical instrument, the guiding system comprising:
        a mirror carrying arrangement having a first and a second surfaces and having a first and a second measurement mirrors mounted on the mirror carrying arrangement and disposed relative to each other at a predetermined angle; and
        a support system secured in the mirror carrying arrangement and providing a first plurality of support points disposed above the first surface and a second plurality of support points disposed below the second surface, the first plurality of support points being suitable for supporting the sample in such a way that the sample does not contact the mirror carrying arrangement, the second plurality of support points supporting the mirror carrying arrangement above the measurement table in such a way that the measurement table does not contact the mirror carrying arrangement.

2. The analytical instrument according to claim 1, wherein the support system comprises a plurality of studs passing through a plurality of through openings in the mirror carrying arrangement and providing the first plurality of support points and the second plurality of support points.

3. The analytical instrument according to claim 2, wherein the second plurality of support points rests on a plurality of ball-shaped members disposed on a surface of the measurement table, the surface of the measurement table having recessed areas for receiving ball-shaped members.

4. The analytical instrument of claim 2, wherein the second plurality of support points is formed by recesses in lower end of the studs.

5. The analytical instrument of claim 2, wherein the plurality of studs comprises support portions contacting the mirror carrying arrangement.

6. The analytical instrument according to claim 1, wherein the mirror carrying arrangement is made as a single piece and wherein the first and the second mirrors are attached to outer sides of the arrangement.

7. The analytical instrument according to claim 1, wherein a material of the measurement table, a material of the support system, and a material of the mirror carrying arrangement have a coefficient of thermal expansion from the range of about $0.01 \times 10^{-6°}$ C. to about $0.03 \times 10^{-6°}$ C.

8. An analytical instrument comprising:
    an optical system defining an optical path of the analytical instrument and directing light onto a sample;
    a measurement table disposed along the optical path; and
    a guiding system disposed along the optical path of the analytical instrument, the guiding system comprising:
        a mirror carrying arrangement having a first and a second surfaces and having a first and a second measurement mirrors mounted on the mirror carrying arrangement and disposed relative to each other at a predetermined angle; and
        a support system comprising a plurality of studs integrated into the measurement table, the upper ends of the plurality of the studs contacting a second plurality of support points, and a plurality of support members disposed on the first surface of the mirror carrying arrangement and forming a first plurality of support points suitable for supporting the sample in such a way that the sample does not contact the mirror carrying arrangement, the second plurality of support points supporting the mirror carrying arrangement above the measurement table in such a way that the measurement table does not contact the mirror carrying arrangement.

9. The analytical instrument according to claim 8, wherein each stud of the plurality of studs is disposed inside an opening of a plurality of openings in the second surface of the mirror carrying arrangement.

10. The analytical instrument according to claim 9, wherein the support system further comprises a plurality of ball-shaped members disposed inside the plurality of openings, the plurality of ball shaped members resting on the upper ends of the plurality of the studs and supporting the mirror carrying arrangement at the second surface.

11. The analytical instrument according to claim 8, wherein the support members are spherically or semispherically shaped.

12. The analytical instrument according to claim 10, wherein some or all of the upper ends of the plurality of the studs comprise recesses for receiving ball shaped members.

13. The analytical instrument according to claim 12, wherein the recesses are of different shapes.

14. The analytical instrument according to claim 10, wherein some or all of the openings of the plurality of the openings comprise recessed areas.

15. The analytical instrument according to claim 9, wherein the first plurality of support points is formed by the plurality of support members and wherein the second plurality of support points if formed by the plurality of support members.

16. The analytical instrument according to claim 15, wherein the support members are spherically shaped.

17. The analytical instrument according to claim 8, wherein a material of the measurement table, a material of the studs, and a material of the mirror carrying arrangement have a coefficient of thermal expansion from the range of about $0.01 \times 10^{-6°}$ C. to about $0.03 \times 10^{-6°}$ C.

18. A displaceable coordinate measurement system comprising:
    a mirror body with two orthogonal mirrors attached to an outer side of the body; and
    a support system comprising a plurality of supporting members for supporting the mirror body above; a measurement table and for supporting a sample above the mirror body, wherein the mirror body, the measurement table and the sample constitute three separate pieces which do not contact each other in the assembled coordinate measurement system.

19. The coordinate measurement system of claim 18, wherein the sample comprises a receptacle and a substrate.

20. The coordinate measurement system of claim 19, wherein the receptacle, the mirror body and the measurement table each comprise coaxial frame-shaped openings.

21. The coordinate measurement system of claim 18, further comprising an optical system for directing light onto two orthogonal mirrors.

22. The coordinate measurement system of claim 18, wherein the plurality of support members comprise vertical studs secured in the mirror body, the vertical studs having upper ends extending above the mirror body to support the sample and having lower ends extending below the mirror body to support the body above the measurement table.

23. The coordinate measurement system of claim 22, wherein the lower ends comprise support portions for receiving the mirror body and wherein the lower ends comprise recesses, each recess having a ball-shaped member attached to it, and wherein each ball-shaped member contacts a surface of the measurement table.

24. The coordinate measurement system of claim 18, wherein the plurality of support members comprise vertical studs incorporated in the measurement table, the vertical studs protruding into the mirror body through a plurality of openings, and a first set of balls resting on upper ends of the vertical studs and supporting the mirror body.

25. The coordinate measurement system of claim 24, wherein the sample is supporter by either the first set of balls or by a second set of support points disposed on an upper surface of the mirror body.

26. The coordinate measurement system of claim 24, wherein the upper ends of the studs comprise recessed areas into which the first set of balls is attached.

27. The coordinate measurement system of claim 24, wherein the plurality of openings comprise recessed areas into which the first set of balls is attached.

28. The coordinate measurement system according to claim 18, wherein a material of the support system and a material of the mirror body have a coefficient of thermal expansion from the range of about $0.01 \times 10^{-6\circ}$ C. to about $0.03 \times 10^{-6\circ}$ C.

* * * * *